United States Patent [19]

Moslehi

[11] Patent Number: 5,700,628
[45] Date of Patent: Dec. 23, 1997

[54] DRY MICROLITHOGRAPHY PROCESS

[75] Inventor: Mehrdad M. Moslehi, Los Altos, Calif.

[73] Assignee: Texas Instruments Incorporated, Dallas, Tex.

[21] Appl. No.: 783,686

[22] Filed: Jan. 15, 1997

Related U.S. Application Data

[60] Continuation of Ser. No. 426,829, Apr. 21, 1995, abandoned, which is a division of Ser. No. 250,691, May 31, 1994, Pat. No. 5,460,693.

[51] Int. Cl.$^6$ .................... G03F 7/20; G03F 7/26; G03F 7/36
[52] U.S. Cl. .................. 430/313; 430/323; 430/325; 430/966; 430/967; 156/643.1; 156/659.11; 378/34
[58] Field of Search ................... 430/311, 313, 430/322, 323, 325, 326, 370.1, 966, 967; 156/643.1, 659.11; 216/41, 49, 51; 378/34

[56] References Cited

U.S. PATENT DOCUMENTS

| | | | |
|---|---|---|---|
| 4,578,155 | 3/1986 | Halliwell et al. | 204/15 |
| 4,595,601 | 6/1986 | Horioka et al. | 427/53.1 |
| 4,605,566 | 8/1986 | Matsui et al. | 427/43.1 |
| 4,608,117 | 8/1986 | Ehrlich et al. | 156/610 |
| 4,612,085 | 9/1986 | Jelks et al. | 156/643 |
| 4,624,736 | 11/1986 | Gee et al. | 156/643 |
| 4,748,134 | 5/1988 | Holland et al. | 437/62 |
| 4,810,601 | 3/1989 | Allen et al. | 430/18 |
| 4,834,834 | 5/1989 | Ehrlich et al. | 156/635 |
| 4,842,989 | 6/1989 | Taniguchi et al. | 430/296 |
| 4,882,008 | 11/1989 | Garza et al. | 156/643 |
| 4,935,377 | 6/1990 | Strifler et al. | 437/41 |
| 4,945,065 | 7/1990 | Gregory et al. | 437/24 |
| 4,978,594 | 12/1990 | Bruce et al. | 430/14 |
| 4,994,140 | 2/1991 | Kenzo et al. | 156/643 |
| 5,015,323 | 5/1991 | Gallagher et al. | 156/345 |
| 5,037,720 | 8/1991 | Khanna | 430/190 |
| 5,055,550 | 10/1991 | Mueller | 528/353 |
| 5,098,866 | 3/1992 | Clark et al. | 437/239 |
| 5,106,770 | 4/1992 | Bulat et al. | 437/40 |
| 5,223,445 | 6/1993 | Fuse | 437/24 |
| 5,312,716 | 5/1994 | Unoki et al. | 430/313 |
| 5,316,895 | 5/1994 | Douglas | 430/313 |
| 5,358,894 | 10/1994 | Fazam et al. | 437/70 |

FOREIGN PATENT DOCUMENTS

| | | | |
|---|---|---|---|
| 0 172 604 | 2/1986 | European Pat. Off. | |
| 0 184 352 | 6/1986 | European Pat. Off. | |
| 90-205834/27 | 11/1988 | European Pat. Off. | H01L 21/02 |
| 0 470 784 A2 | 2/1992 | European Pat. Off. | |
| 3942472 A1 | 12/1989 | Germany. | |
| 62-76521 (A) | 4/1987 | Japan | H01L 21/302 |
| 2-188918 (A) | 7/1990 | Japan | H01L 21/302 |
| 4-37129 (A) | 2/1992 | Japan | H01L 21/302 |
| PCT/US82/00745 | 6/1982 | WIPO | C23C 13/00 |

OTHER PUBLICATIONS

M. J. Bowden, "Forefront of Research on Resists", Solid State Technology/Jun. 1981, pp. 73–87.

Cheryl F. Corallo and Gar B. Hoflund, "An Energy–resolved, Electron–stimulated Desorption Study of Hydrogen from Cleaned and Oxidized Si(100)", Surface and Interface Analysis, vol. 12, 1988, pp. 297–302.

R. S. Becker, G.S. Higashi, Y.J. Chabaland A.J. Becker, "Atomic Scale Conversion of Clean Si (111):H–1×1 to Si(111)–2×1 by Electron–Stimulated Desorption", Physical Review Letters vol. 65 No. 15, Oct. 8, 1990, pp. 1917–1920.

E.C. Ekwelundo and A. Ignatiev, "Electron Stimulated Desorption of Positive Ions From an Adsorbate–Covered Si(100) Surface", Surface Science 215 (1989) pp. 91–101.

R.M. Wallace, P.A. Taylor, W.J. Choyke and J. T. Yates, Jr., "An ESDIAD Study of Chemisorbed Hydrogen on Clean and H–exposed Si(111)–(7×7)", Surface Science 239 (1990) pp. 1–12.

John J. Boland, "Structure of the H–Saturated Si(100) Surface", Physical Review Letters vol. 65, No. 26, Dec. 24, 1990, pp. 3325–3328.

S.C. McNevin, "Radio Frequency Plasma Etching Of Si/SiO$_2$ by Cl$_2$/O$_2$: Improvements Resulting From the Time Modulation Of the Processing Gases", J. Vac. Sci. Techonol. B 8 (6), Nov./Dec. 1990, pp. 1185–1191.

(List continued on next page.)

Primary Examiner—Kathleen Duda
Attorney, Agent, or Firm—Kay Houston; W. James Brady, III; Richard L. Donaldson

[57] ABSTRACT

An all–dry microlithography process, where a fluorinated layer 30 is deposited on a processable layer 18 of a semiconductor wafer, and regions of the fluorinated layer 30 are exposed to a masked radiation source so that exposed regions and unexposed areas 31 are formed in the fluorinated layer 30. An oxide layer is grown on the fluorinated layer, forming thicker region 34 of oxide on the unexposed areas 31 of the fluorinated layer 30, and forming thinner regions 32 of oxide on the exposed regions of the fluorinated layer 30. The oxide layer is then etched, removing thinner regions 32 of the oxide layer but leaving at least a fraction of the thicker portions 34 of the oxide layer to be used as a patterned hard mask. Then the exposed fluorinated layer not covered by the patterned oxide hard mask, is etched, to expose areas of the processable layer 18 not covered by the oxide hard mask, for subsequent patterned processing. The subsequent patterned processing may be an etch process for pattern transfer to the processable layer, a doping process to dope the exposed regions of the processable layer, or another process such as a deposition step.

The all–dry lithography process can be completed in an integrated environment, such as a cluster tool, resulting in improved manufacturing cycle time and increased yields. The dry photosensitive layer may be deposited using PECVD at low temperatures, and is compatible with all other semiconductor device fabrication process flows.

10 Claims, 4 Drawing Sheets

OTHER PUBLICATIONS

P. Dumas, "Coupling of as Adsorbate Vibration to a Substrate Surface Phonon: H on Si(111)", Physical Review Letters, vol. 65, No. 9, Aug. 27, 1990, pp. 1124–1127.

J. A. Dagata, J. Schneir, H.H. Harary, C.J. Evans, M.T. Postek, and J. Bennett, "Modification of Hydrogen–Passivated Silicon By a Scanning Tunneling Microscope Operating in Air", Appl. Phys. Lett., vol. 56, No. 20, May 14, 1990, pp. 2001–2003.

W. R. Brunsvoid, D.M. Crockatt, G.J. Hefferon, C.F. Lyons, "Resist Technology for Submicrometer Optical Lithogrphay", POptical Engineering/Apr. 1987/vol. 26 No. 4, pp. 331–336.

Makoto Nakase, "Potential of Optical Lithography", Optical Engineering/Apr. 1987/vol. 26 No. 4, pp. 319–324.

Yukinori Ochiai, Shinji Matsui, Katsumi Mori, "Focused Ion Beam Technology", Solid State Technology/Nov. 1987, pp. 75–79.

E. Ong and E.L. Hu, "Multilayer Resists for Fine Line Optical Lithography", Solid State Technology/Jun. 1984, pp. 155–160.

Gene E. Fuller, "Optical Lithography Status", Solid State Technology/Sep. 1987, pp. 113–118.

Rebecca J. Gale, Mike Tipton, and Tim Wooldridge, "Photolithography and Dry Etch for the MMST Program", TI Technical Journal, Sep.–Oct. 1992, pp. 65–75.

S. M. Sze, VLSI Technology, Second Edition, Copyright 1988, by Bell Telephone Laboratories, Inc., p. 114.

DRY MICROLITHOGRAPHY PROCESS

CROSS-REFERENCE TO RELATED APPLICATIONS

This application is a continuation of application Ser. No. 08/426,829, filed Apr. 21, 1995, now abandoned, which is a division of application Ser. No. 08/250,691, filed May 31, 1994, now U.S. Pat. No. 5,460,693.

U.S. patent application, Ser. No. 07/997,632, entitled *Method to Produce Masking*, filed on Dec. 29, 1992 by Douglas et al, and U.S. patent application Ser. No. 07/954,626 entitled *Process for Producing Nanometer-size Structures on Surfaces Using Electron Beam Induced Chemistry Through Electron Stimulated Desorption* filed Sep. 30, 1992 by Wallace.

FIELD OF THE INVENTION

The present invention relates generally to lithographic techniques used for pattern formation in the fabrication of microelectronic devices. More specifically, the present invention relates to a dry photoresist process and an all-dry microlithography process for semiconductor integrated circuit manufacturing without a need for wet processes.

BACKGROUND OF THE INVENTION

Semiconductors are widely used in integrated circuits for electronics applications, including information systems. Such integrated circuits typically employ many transistors and multiple levels of device interconnects fabricated in single crystal silicon. Various device layers are sequentially formed on a semiconductor wafer using a combination of microlithography and etch processes.

Microlithography is a commonly practiced process of creating a patterned mask on the surface of a semiconductor wafer so that subsequent patterned processes may be performed. Typically these subsequent patterned processes involve the addition or subtraction of a material by deposition, implant doping, or plasma etching. Frequently, the pattern is transferred from an exposure mask to the wafer using a photoresist layer and optical lithography exposure tools.

A problem or limitation with current lithography processes is that wet liquid-based processes are used for depositing the photoresist layer and for post-exposure pattern development, which results in frequent wafer transport and handling, increased wafer contamination, reduced manufacturing yield, and relatively long device manufacturing cycle times. The photoresist layer is an organic material which is applied as a liquid layer via spin coating and is developed using organic solvents after exposure to a radiation source through an exposure mask. After performing the patterned process (deposition, etch, or ion implantation) the resist layer is stripped using wet solvents or a dry (photochemical or plasma) removal process. Since the conventional microlithography techniques rely on liquid-based processes, the wafer is exposed to atmosphere and liquid chemicals repeatedly throughout the patterning process flow. These repeated exposures can introduce various contaminants on the wafer surface. Moreover, the resist layer itself may leave various metallic and organic contaminants on the surface, resulting in device performance and reliability degradations. For these reasons, there is a trend towards integrated processing and increasing use of cluster tools, which has placed a demand on replacement of batch (multi-wafer) processes with single-wafer equipment alternatives, and wet processes with dry processes. Complete integrated microlithography cluster tool equipment is not currently available because the photoresist coat and development processes typically used for microlithography are wet processes and cannot be cluster integrated with vacuum deposition or etch processes.

Advancements over the last few years have resulted in dry develop processes such as the "DESIRE" (Diffusion Enhanced SIlylated REsist) process. In the DESIRE process, the resist is first spin coated an exposed to the light through a mask. Then, it is exposed to a silicon-containing compound that diffuses preferentially into the exposed areas of the resist film. Subsequently, the resist pattern is formed using a dry development process in an oxygen plasma. The oxygen plasma exposure step removes the unexposed resist while leaving a silicon-containing hard mask in the exposed and silylated areas. The gas-phase silylation process employs hexamethyldisilazane (HMDS) as a source. The DESIRE process eliminates the need for liquid-based development of the resist.

Techniques have been developed (e.g. at AT&T Bell Labs and MIT Lincoln Lab.) using plasma-assisted polymerization processes for dry deposition of the photosensitive layer. However, formation of the photosensitive layer (photoresist) used for image transfer in semiconductor manufacturing environments is still based on spin-on wet coating. The plasma-deposited photoresist processes developed to date produce layers with relatively poor contrast and sensitivity characteristics compared to the standard spin-on resist.

SUMMARY OF THE INVENTION

This invention is an all-dry process of lithography, where a fluorinated layer, preferably fluorinated amorphous silicon, fluorinated polycrystalline silicon, or fluorinated silicon germanium, is deposited on a semiconductor wafer, and regions of the fluorinated semiconductor layer are exposed so that exposed areas and unexposed areas are formed in the fluorinated layer. An oxide layer is then grown on the fluorinated layer, forming thicker regions of oxide on the unexposed areas of the fluorinated layer, and forming thinner regions of oxide on the exposed areas of the fluorinated layer. The oxide layer is then etched, removing the thinner regions of the oxide layer but leaving at least a fraction of the thicker regions of the oxide layer. Then a selective etch process is performed in order to remove the exposed remaining fluorinated layer, leaving a patterned hard mask layer comprising a top oxide layer and a fluorinated semiconductor underlayer. The part&reed hard mask layer is used to perform a subsequent patterned process such as etch, ion implantation, or selective deposition, prior to its removal. All steps in the present invention are dry processes.

The elimination of wet processing steps enables the use of integrated cluster tools for a microlithography process flow. With an all-dry microlithography process, several processes can be performed on one duster equipment platform in a controlled environment (e.g. a vacuum), eliminating human handling of wafers and minimizing exposure to atmospheric and liquid-induced contaminants during the entire lithography process. Performing dry microlithography on integrated cluster tools increases manufacturing yields and improves overall semiconductor device manufacturing cycle time.

The method of the all-dry microlithography invention is compatible with existing DUV (deep ultra violet) optical stoppers as well as X-ray lithography and other exposure tools. This invention can be used with existing installed DUV lithography equipment base. Also, this invention can be used for pattern generation both during the front end (during fabrication of the transistor structures) and back end (fabrication of the interconnect) portions of semiconductor manufacturing.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The process of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention. Corresponding numerals and symbols in the different figures refer to corresponding parts unless otherwise indicated. Table 1 below provides an overview of the elements of the embodiments and the drawings.

TABLE 1

| Drawing Element | Generic Term | Specific Examples or Alternates |
|---|---|---|
| 10 | Semiconductor wafer | Semiconductor wafer |
| 14 | Field insulating layer | Field oxide |
| 16 | Gate dielectric | Gate oxide |
| 18 | Processable layer | Polysilicon layer; processable layer to be patterned; processable polysilicon layer |
| 20 | Substrate | Layers of patterned gates; silicon |
| 22 | Resist layer | Photoresist layer; photosensitive material |
| 24 | Blocking layer on the mask | Chromium layer on the mask |
| 30 | Fluorinated layer | Fluorinated amorphous or polycrystalline silicon; Fluorinated Silicon Germanium (either amorphous or polycrystalline); Photosensitive material |
| 31 | Unexposed areas of fluorinated layer | Unexposed areas of Fluorinated silicon; Unexposed areas of fluorinated silicon germanium |
| 32 | Thinner regions of oxide layer | Thinner regions of silicon dioxide grown on exposed regions of fluorinated layer |
| 34 | Thicker regions of oxide layer | Thicker regions of silicon dioxide grown on exposed regions of fluorinated layer |

Figure 1:
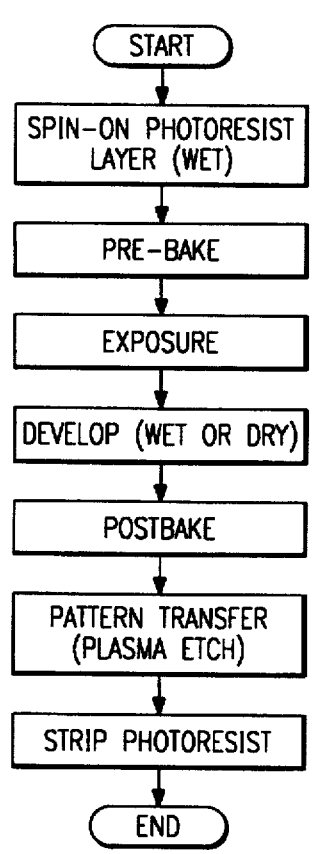
FIG. 1 is a flow diagram of a typical prior art microlithography process.

FIG. 1 shows the process flow for the existing (prior art) microlithography patterning process. As shown, the photoresist layer is spun on with a wet process, and then a prebake process step is performed to drive out the solvent and solidify the layer. Next, an exposure may either be performed through a mask by one of several methods used commonly in the industry (e.g. optical or X-ray microlithography), or without the use of a mask (e.g. electron-beam or ion beam lithography). Then, a wet or dry develop process and subsequent solidifying postbake process may be performed, and the pattern is transferred to the underlying region typically with a plasma etch process. Finally, the photoresist is removed using a plasma and/or wet strip process.

FIG. 2 shows an example of patterning a polysilicon gate for an IGFET device with the process flow of FIG. 1. FIG. 2a shows a cross-section of the semiconductor wafer 10 at the start of the process, with field oxide 14, previously grown (or deposited) gate dielectric 16 and processable polysilicon layer 18 deposited by, for example, low-pressure chemical vapor deposition (LPCVD), on top of field oxide 14 and gate dielectric 16. First, the photoresist layer 22 is spun on, as shown in FIG. 2b. The wafer may then be masked (the mask itself is not shown) with the blocking layer on the mask 24 (FIG. 2b) and exposed. Either a positive or negative photoresist is used: a positive photoresist is shown, where the regions exposed to the light are later removed. The structure is shown after development in FIG. 2c, with the exposed regions of the photoresist layer 22 removed. Then the postbake and pattern transfer, or plasma etch, is performed, removing the exposed region of polysilicon layer 18, as shown in FIG. 2d. The patterned photoresist layer 22 may then be stripped, or ashed, leaving the structure shown in FIG. 2e.

Figure 3:
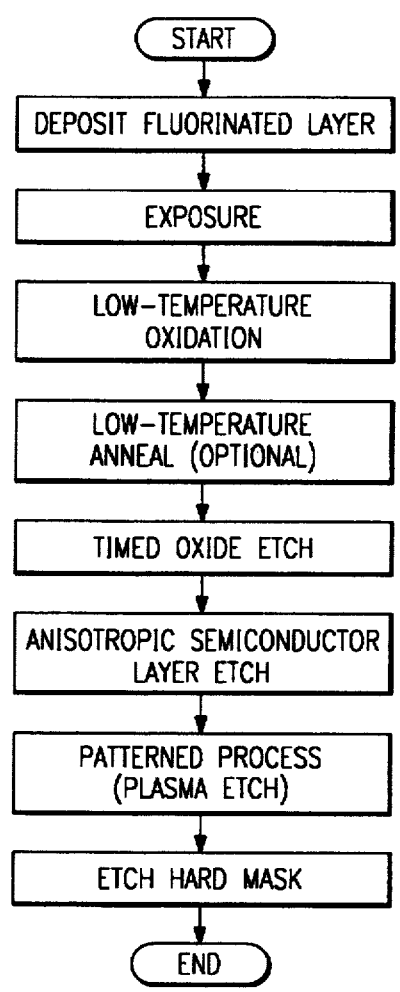
FIG. 3 is a flow diagram depicting process steps which can be used in the all-dry microlithography invention.
Figure 2A:
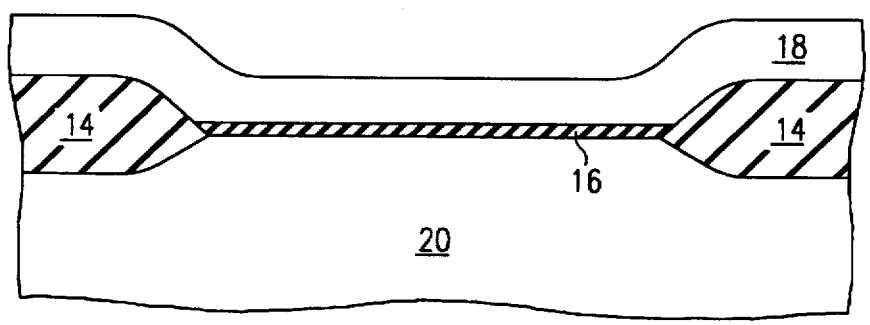
FIGS. 2a–2e show cross-sectional views of a semiconductor device (e.g. an insulated-gate field-effect transistor or IGFET) upon which the prior art microlithography process is used.
Figure 2B:
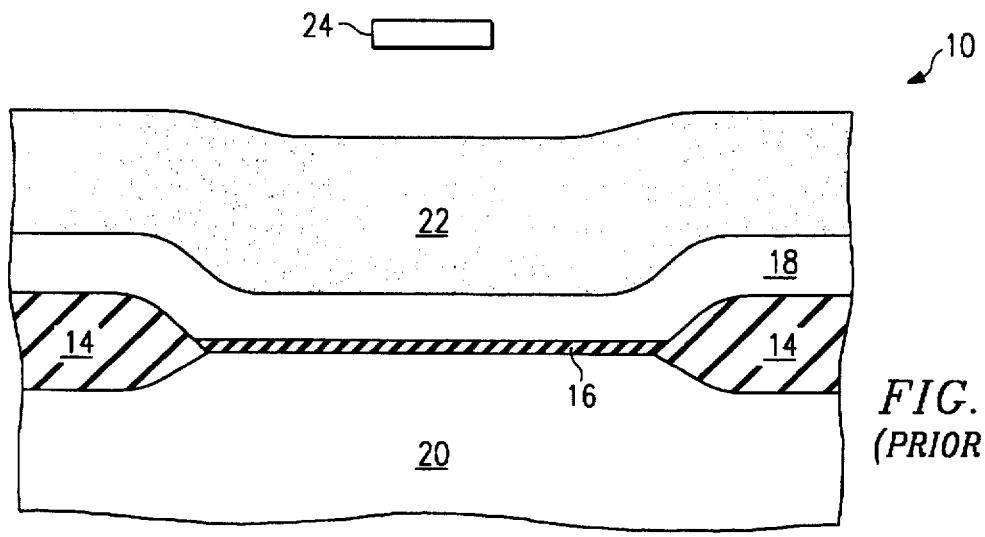
Figure 2C:
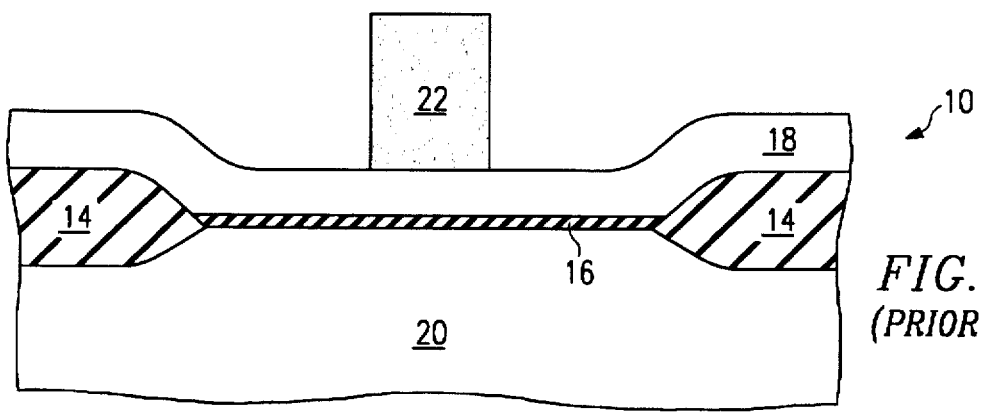
Figure 2D:
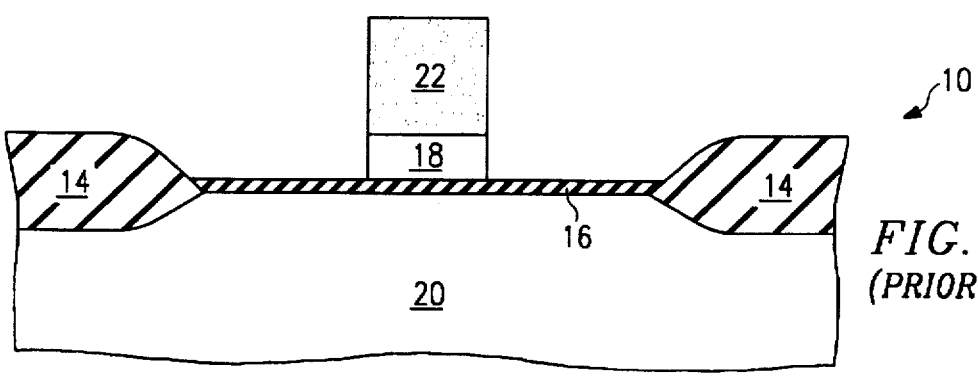
Figure 2E:
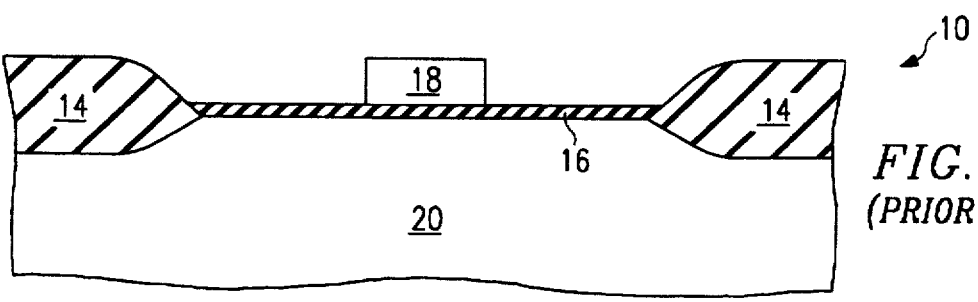

A flow chart of the process steps in the new invention, the all-dry microlithography process, is shown in FIG. 3. The effects of these process steps on a semiconductor device such as an IGFET is shown in cross-sectional view in FIG. 4. This process may be performed for pattern formation in semiconductor device fabrication process flows for patterned etch, doping, selective deposition and other applications.

A typical all-dry microlithography pattern generation based on this invention is shown in FIG. 4. As in the prior art, FIG. 4a shows a cross-section of the semiconductor wafer 10 at the start of the process, with field oxide 14, previously grown gate dielectric 16 and processable layer (e.g. polysilicon layer) 18 deposited by, for example, an LPCVD process, on top of field oxide 14 and gate dielectric 16. First, a thin fluorinated layer 30, for example, 100 to 1000 Å of fluorinated amorphous or polycrystalline silicon, fluorinated amorphous silicon germanium, or fluorinated polycrystalline silicon germanium, is deposited on polysilicon layer 18 with a PECVD (plasma-enhanced chemical vapor deposition) process (FIG. 4b). This deposition process can be performed with PECVD at a substrate temperature of less than 400° C. It is also possible to deposit the fluorinated layer by a reactive sputtering process or a semiconductor layer deposition process followed by fluorine ion implantation. The fluorinated layer 30 serves as the photosensitive material in this invention, replacing the conventional spin-coated photoresist material.

Figure 4A:
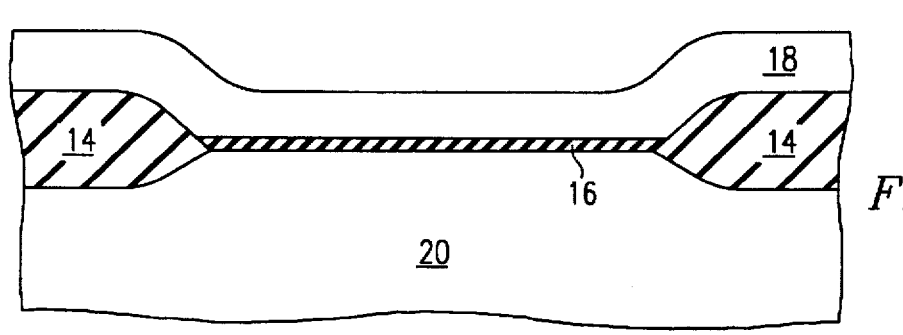
FIGS. 4a–4h shows cross-sectional views of a semiconductor device (e.g. an IGFET) upon which the all-dry microlithography process of this invention is used.
Figure 4B:
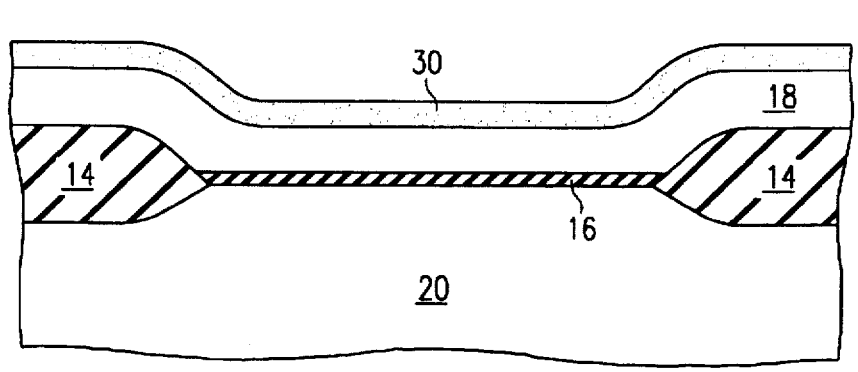
Figure 4C:
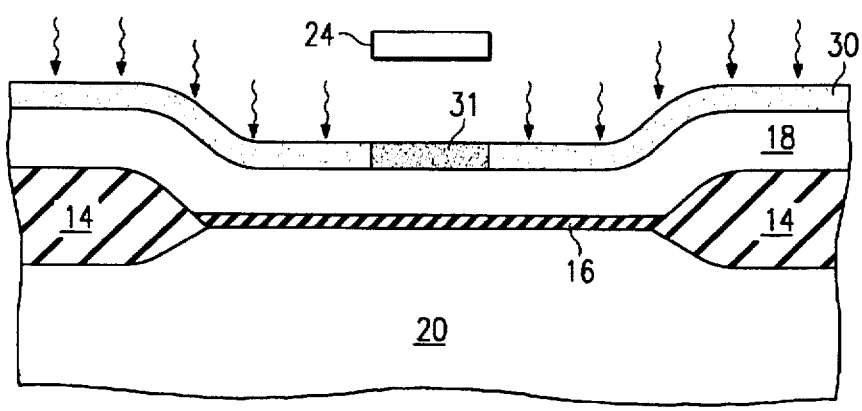
Figure 4D:
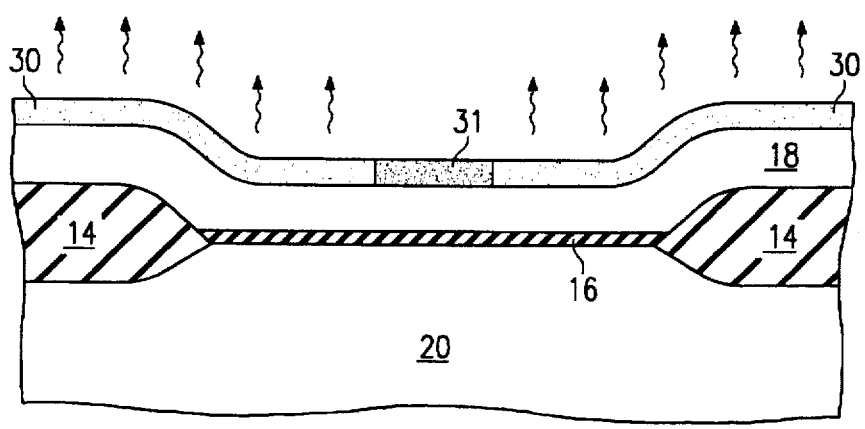

Next the wafer 10, and more specifically, the fluorinated layer 30, is exposed to an energetic radiation, preferably a DUV (deep ultraviolet) optical exposure through a mask (FIG. 4c). The energetic radiation breaks the bonds between silicon (or semiconductor atoms) and fluorine, releasing fluorine atoms in exposed regions. Breakage of silicon and fluorine bonds by DUV photons (e.g. 193 nm DUV radiation) has been well documented in the research work on semiconductor surface cleaning. Some silicon surface cleaning processes such as HF-vapor cleaning may result in partial passivation of silicon surface with fluorine (due to Si—F bonds). It is, however, desirable to produce a hydrogen-passivated surface without any fluorine passivation for some device fabrication processes such as epitaxial silicon growth. Thus, DUV flash exposure has been shown to be effective for breakage of Si—F bonds for silicon surface preparation prior to epitaxial silicon growth. The present invention employs the DUV-assisted Si—F bond breakage phenomenon in order to enable pattern transfer from a mask to the fluorinated layer.

Next, a low-temperature (in the range of 250° C. to 800° C., typically 400° C.) thermal anneal step may be performed in which the released fluorine species is outdiffused from the exposed regions of the photosensitive layer 30 (FIG. 4d), leaving unexposed areas of the fluorinated layer 31. This thermal anneal step is optional: if used, it may be performed either simultaneously with the lithography exposure step, or in a separate step. When the exposure and anneal steps are combined, the wafer 10 is heated while it is being exposed. This low-temperature thermal anneal step will not affect the Si—F bonds in the unexposed regions, since Si—F bonds are not broken thermally for temperatures below 850° C.

Figure 4E:
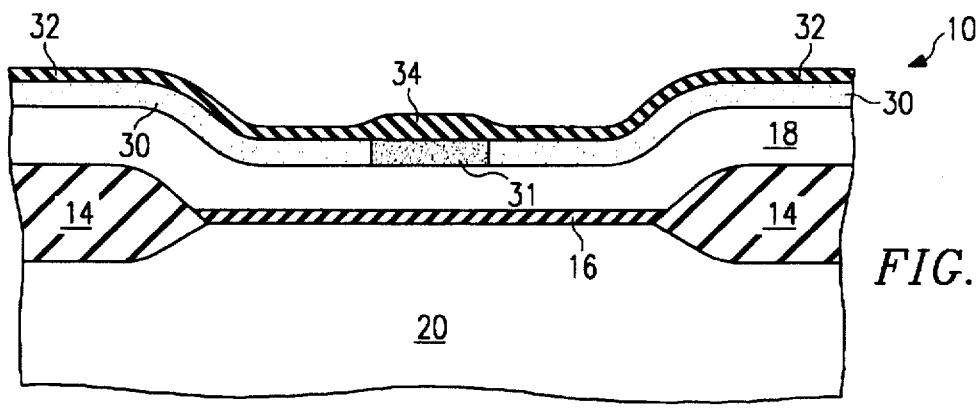
Figure 4F:
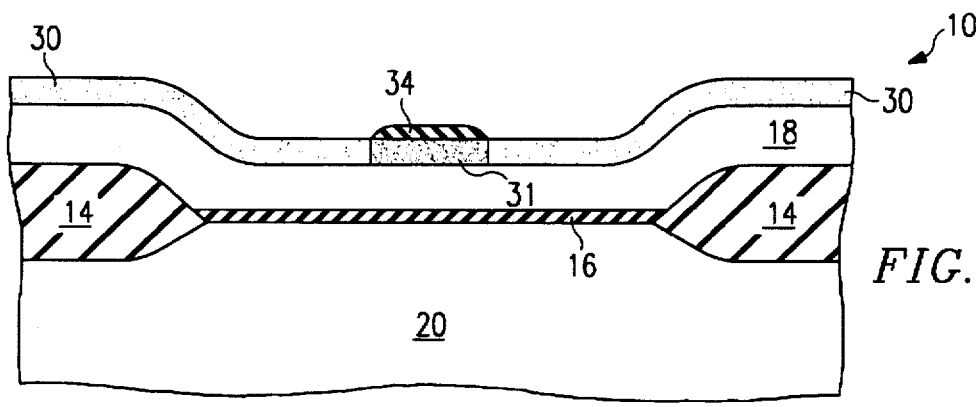
Figure 4G:
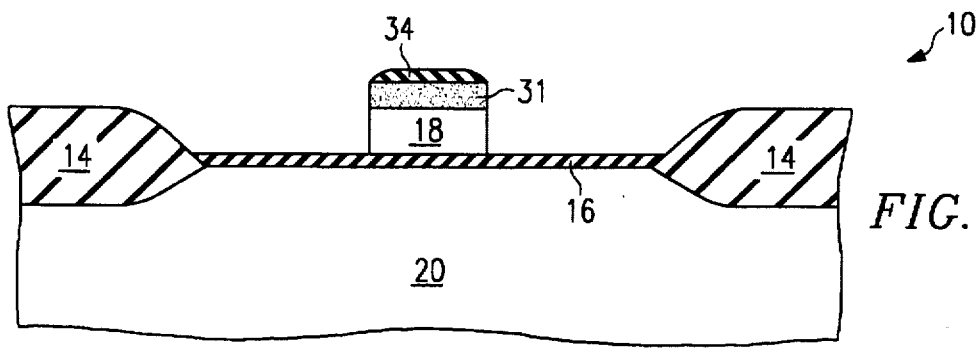

The next step is to perform an oxidation process at preferably less than 800° C. but greater than 100° C. (typically at 350° C. to 450° C.), utilizing plasma-enhanced or photo-enhanced oxidization (FIG. 4e). It is well known that presence of fluorine results in a significant enhancement of silicon oxidation rate. Thus, this process step results in the growth of an oxide layer with a thicker region 34 on the unexposed fluorinated areas 31 due to the catalytic effects of fluorine, and a thinner region 32 on the exposed regions. The thicker region 34 is typically at least 50% thicker than the thinner region 32.

Next, a timed plasma oxide etch is performed (FIG. 4f) to completely remove the thinner regions of oxide 32 from the exposed regions of the fluorinated layer 30. Part of the thicker region of the oxide layer 34 remains (due to a large oxide thickness difference between the exposed and unexposed regions), forming a hard oxide mask pattern on the semiconductor wafer.

The next step is to perform a selective anisotropic silicon etch (FIG. 4g) to transfer the pattern to the fluorinated layer 30. The remaining (thicker) regions of the oxide layer 34 over the original fluorinated regions act as a hard mask to prevent etching in the unexposed regions. In the example shown, the selective anisotropic silicon etch process step used for pattern transfer from the patterned oxide hard mask to the original fluorinated regions is also utilized for polysilicon gate formation.

Figure 4H:
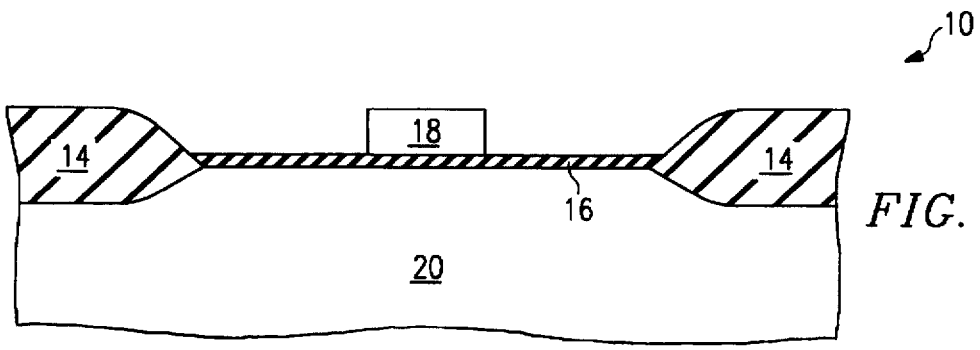

Finally, subsequent process steps (e.g. plasma removal of the patterned mask) are performed as required in order to complete the lithography process and achieve the results shown in FIG. 4h. In the gate patterning example shown here, removal of the patterned hard mask (thicker regions of oxide layer 34 and unexposed areas of fluorinated layer 31) is optional prior to the subsequent device fabrication steps such as sidewall spacer formation and source/drain junction doping. If this method of lithography is performed for the purpose of a patterned ion implantation, it is not necessary to perform an etch. In some cases, the plasma etch for pattern transfer may also be used for in-situ removal of the hard mask, eliminating one process step.

While the preferred embodiments have been described above, alternate methods may be employed for various processes. For example, the fluorinated layer 30 may also be deposited by methods other than LPCVD, such as PVD (physical vapor deposition), PECVD (plasma-enhanced chemical vapor deposition), or other deposition means. The exposure step shown in FIG. 4c may be performed using other types of energetic particle beam, such as x-ray, electron beam, or ion beam, some of which require a mask (X-ray lithography), while others do not (electron-beam or ion beam lithography).

There are many advantages to the all-dry microlithography invention, a very important one being the capability of having a completely integrated cluster tool for microlithography. This allows several processes to be performed on one equipment platform in a controlled environment, with very little wafer handling and exposure to atmospheric and photoresist contaminants, thus increasing manufacturing yields and improving the overall manufacturing cycle time.

Also, the method of the all-dry microlithography invention is compatible with existing and future DUV (deep ultra violet) optical steppers as well as X-ray lithography tools. The present invention can be easily implemented using vacuum-integrated cluster tool equipment technology.

A further advantage of the invention is the ability to deposit the photosensitive layer (fluorinated layer 30) at reduced temperatures, enabling this lithography process to be used virtually anywhere in the semiconductor fabrication process, including the "back end", for multilevel interconnects. The process temperature is low enough that the photosensitive layer deposition and plasma oxidation are compatible with aluminum metallization.

A further advantage of the present invention is the elimination of organic photoresist processing and the metallic and organic contamination associated with the existing photoresist materials. Thus, the invention eliminates the need for semiconductor wafer cleaning to remove the residual photoresist-induced contaminants.

While the all-dry microlithography process of this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for dry lithography processing of semiconductor wafers, comprising the steps of;

depositing a fluorinated photosensitive layer on said wafer; and patterning said fluorinated photosensitive layer using a dry development step, wherein said patterning step comprises exposing portions of said fluorinated photosensitive layer to radiant energy, wherein exposed areas and unexposed areas are formed in said fluorinated photosensitive layer, wherein said radiant energy is deep ultraviolet energy.

2. The method of claim 1 wherein said fluorinated photosensitive layer comprises silicon.

3. The method of claim 2 wherein said fluorinated photosensitive layer also comprises germanium.

4. The method of claim 1 wherein said deep ultraviolet energy has a wavelength, wherein said wavelength is 193 nm.

5. A method for dry lithography processing of semiconductor wafers, comprising the steps of;
   depositing a fluorinated photosensitive layer on said wafer; and
   exposing portions of said fluorinated photosensitive layer to radiant energy, wherein exposed areas and unexposed areas are formed in said fluorinated photosensitive layer, wherein a development step is dry, and wherein said radiant energy is X-ray energy.

6. The method of claim 5 wherein said fluorinated photosensitive layer comprises silicon.

7. The method of claim 6 wherein said fluorinated photosensitive layer also comprises germanium.

8. A method for dry lithography processing of semiconductor wafers, comprising the steps of;
   depositing a fluorinated photosensitive layer on said wafer; and
   patterning said fluorinated photosensitive layer using a dry development step, wherein said patterning step comprises exposing portions of said fluorinated photosensitive layer to radiant energy, wherein exposed areas and unexposed areas are formed in said fluorinated photosensitive layer, wherein said radiant energy is X-ray energy.

9. A method for dry lithography processing of semiconductor wafers, comprising the steps of;
   depositing a fluorinated photosensitive layer on said wafer; and
   exposing portions of said fluorinated photosensitive layer to radiant energy, wherein exposed areas and unexposed areas are formed in said fluorinated photosensitive layer, wherein a development step is dry, and wherein said radiant energy is deep ultraviolet energy.

10. The method of claim 9 wherein said deep ultraviolet energy has a wavelength, wherein said wavelength is 193 nm.

* * * * *